(12) United States Patent
Lee et al.

(10) Patent No.: US 8,810,309 B2
(45) Date of Patent: Aug. 19, 2014

(54) STACK PACKAGE AND METHOD FOR SELECTING CHIP IN STACK PACKAGE

(75) Inventors: Dae Woong Lee, Yongin-si (KR); Yu Gyeong Hwang, Seoul (KR); Jae Hyun Son, Gwangju (KR); Tae Min Kang, Seoul (KR); Chul Keun Yoon, Suwon-si (KR); Byoung Do Lee, Incheon (KR); Yu Hwan Kim, Icheon (KR)

(73) Assignee: SK Hynix Inc., Gyeonggi-do (KR)

( * ) Notice: Subject to any disclaimer, the term of this patent is extended or adjusted under 35 U.S.C. 154(b) by 62 days.

(21) Appl. No.: 13/330,970

(22) Filed: Dec. 20, 2011

(65) Prior Publication Data
US 2012/0154020 A1 Jun. 21, 2012

(30) Foreign Application Priority Data
Dec. 20, 2010 (KR) .......................... 10-2010-0130731

(51) Int. Cl.
*H01L 23/48* (2006.01)
(52) U.S. Cl.
USPC .......................................... 327/564; 327/530
(58) Field of Classification Search
None
See application file for complete search history.

(56) References Cited

U.S. PATENT DOCUMENTS

| 7,446,420 | B1* | 11/2008 | Kim | 257/777 |
| 7,768,114 | B2* | 8/2010 | Choi | 257/686 |
| 8,243,485 | B2* | 8/2012 | Jin et al. | 365/51 |
| 8,310,855 | B2* | 11/2012 | Riho | 365/63 |
| 2011/0260331 | A1* | 10/2011 | Lee | 257/774 |

FOREIGN PATENT DOCUMENTS

| JP | 2005-122823 A | 5/2005 |
| KR | 1020090095003 A | 9/2009 |
| KR | 1020100002863 A | 1/2010 |
| KR | 1020100129072 A | 8/2010 |
| KR | 1020110046892 A | 5/2011 |

* cited by examiner

*Primary Examiner* — Lincoln Donovan
*Assistant Examiner* — Terry L Englund
(74) *Attorney, Agent, or Firm* — William Park & Associates Patent Ltd.

(57) ABSTRACT

A stack package having a plurality of stacked chips includes first voltage dropping units respectively formed in the plurality of chips, the first voltage dropping units are electrically coupled by a first line; second voltage dropping units respectively formed in the plurality of chips, the second dropping units are electrically coupled by a second line; first signal generation units respectively formed in the plurality of chips, each of the first signal generation units is connected to an output node of the first voltage dropping units, respectively; and second signal generation units respectively formed in the plurality of chips, each of the second signal generation units is connected to an input node of the second voltage dropping units, respectively.

5 Claims, 6 Drawing Sheets

STACK PACKAGE AND METHOD FOR SELECTING CHIP IN STACK PACKAGE

CROSS-REFERENCES TO RELATED APPLICATIONS

The present application claims priority under 35 U.S.C 119(a) to Korean Application No. 10-2010-0130731, filed on Dec. 20, 2010, in the Korean Intellectual Property Office, which is incorporated herein by reference in its entirety.

BACKGROUND

Exemplary embodiments of the present invention relate generally to a stack package, and more particularly, to a stack package including through-silicon vias (TSVs), which can enable a chip to be easily selected, and a method for selecting a chip in a stack package.

Small sized, high performing electronic products require ultra-miniaturized, high memory capacity semiconductor memory devices. To improve the storage capacity, a semiconductor memory device can be made with a semiconductor chip that is more highly integrated and in a semiconductor package having a plurality of chips. Packaging is generally considered to be more effective and less costly to increase storage capacity as compared to improving the degree of high integration in the semiconductor chip.

A multi-chip package includes a plurality of semiconductor chips, and the semiconductor chips are mounted horizontally or vertically in a semiconductor package. To mount more semiconductor chips in a semiconductor package, a stack type multi-chip package in which semiconductor chips are mounted vertically is used. Furthermore, through-silicon via (TSV) is one of the enabling technologies for the stack type multi-chip package with high density and high performance.

FIG. 1 is a perspective view of a known stack package, FIG. 2 is a cross-sectional view of the part A (the chip selection pad part) of FIG. 1, and FIG. 3 is a plan view showing an example of connecting chip selection pads using redistribution layers.

Referring to FIG. 1, semiconductor chips 20, 30, 40 and 50 are stacked on a substrate 10 and are connected with one another by means of through-silicon vias (TSVs) 24, 34, 44 and 54. A Vcc pad 12 and a Vss pad 14 are formed on the substrate 10, and various I/O pads are formed on the respective chips 20, 30, 40 and 50. Some of the I/O pads serve as chip selection pads 22, 32, 42 and 52 used for selecting chips. In the case where the same chips 20, 30, 40 and 50 are stacked using the through-silicon vias 24, 34, 44 and 54, since the chip selection pads 22, 32, 42 and 52 are formed at the same vertical position, chip selection cannot be implemented using the through-silicon vias 24, 34, 44 and 54. Accordingly, redistribution layers 26, 36, 46 and 56 are formed on the respective chip selection pads 22, 32, 42 and 52 to be connected with through-silicon vias 28, 38, 48 and 58 which are formed at different positions. However, since the redistribution layers 26, 36, 46 and 56 of the stacked chips 20, 30, 40 and 50 have different patterns, processing costs increase and difficulties exist in administrating processes.

FIG. 4 is a perspective view showing a method for selecting a chip using wires. Referring to FIG. 4, in the case where the same semiconductor chips 20, 30, 40 and 50 are stacked, since chip pads are formed at the same positions, semiconductor chips 20, 30, 40 and 50 are stacked in a step-like shape, and chip selection pads 22, 32, 42 and 52 are connected with a Vcc pad 12 and a Vss pad 14 using wires W so as to be capable of applying chip selection signals to the semiconductor chips 20, 30, 40 and 50. Nevertheless, wire bonding for chip selection increases the thickness of a package and the lengths of the wires W increase depending upon the number of semiconductor chips, causing signal delay and degrading the structural reliability of a package.

SUMMARY

In an embodiment, a stack package having a plurality of chips which are stacked upon one another includes: first voltage dropping units respectively provided in the plurality of chips, the first voltage dropping units are electrically coupled by a first line; second voltage dropping units respectively provided in the plurality of chips the second dropping units are electrically coupled by a second line; first signal generation units respectively formed in the plurality of chips, each of the first signal generation units is connected to an output node of the first voltage dropping units, respectively; and second signal generation units respectively formed in the plurality of chips. Each of the second signal generation units is connected to an input node of the second voltage dropping units, respectively, wherein a first bias is applied to be transferred from the first voltage dropping unit of the lowest chip to the first voltage dropping unit of the highest chip through the first line, and a second bias is applied to be transferred from the second voltage dropping units of the highest chip to the second voltage dropping unit of the lowest chip through the second line.

The respective first voltage dropping units and the respective second voltage dropping units may be through-silicon vias which are provided in the plurality of chips.

The through-silicon vias may include at least any one metal selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), a nitride of those metals, or polysilicon.

The respective first voltage dropping units and the respective second voltage dropping units may be resistors which are formed on respective through-silicon vias provided in the plurality of chips.

The first signal generation units may apply on signals when the voltage of the first line is equal to or greater than a preset voltage, and the second signal generation units may apply on signals when the voltage of the second line is equal to or greater than a preset voltage.

The first signal generation units may include first diodes, and the second signal generation units may include second diodes.

The chip selection signal generation units may include one or more logic gates which receive, as input signals, signals outputted from the first diodes and the second diodes.

The chip selection signal generation units may include AND gates or NOR gates which receive, as input signals, signals outputted from the first diodes and the second diodes.

The first signal generation units may include first transistors of which gate electrodes are connected to the first line, the second signal generation units may include second transistors of which gate electrodes are connected to the second line, and the chip selection signal generation units may have dual transistor structures in which drain electrodes of the first transistors and source electrodes of the second transistors are connected with each other and chip selection signals are generated from source electrodes of the first transistors or drain electrodes of the second transistors.

Current flow directions of the first line and the second line may be opposite to each other.

The amount of voltage drop of the first voltage dropping units and the second voltage dropping units respectively provided in the respective chips may be the same.

The amount of voltage drop of the first voltage dropping units and the second voltage dropping units may be the same.

In an embodiment, a method for selecting a chip in a stack package having a plurality of chips which are stacked upon one another includes: applying a first voltage to a first line which connects in series first voltage dropping units respectively provided in the plurality of chips and a second voltage to a second line which connects in series second voltage dropping units respectively provided in the plurality of chips; generating first signals from first signal generation units according to voltages of the first line in the respective chips and second signals from second signal generation units according to voltages of the second line in the respective chips; and combining the first signals and the second signals and generating chip selection signals.

In the applying of the first voltage to the first line which connects in series the first voltage dropping units respectively provided in the plurality of chips and the second voltage to the second line which connects in series the second voltage dropping units respectively provided in the plurality of chips, the first voltage dropping units and the second voltage dropping units may be through-silicon vias.

In the applying of the first voltage to the first line which connects in series the first voltage dropping units respectively provided in the plurality of chips and the second voltage to the second line which connects in series the second voltage dropping units respectively provided in the plurality of chips, current flow directions of the first line and the second line may be opposite to each other.

In the generating of the first signals from the first signal generation units according to the voltages of the first line in the respective chips and the second signals from the second signal generation units according to the voltages of the second line in the respective chips, on signals may be applied when the voltages of the first line are equal to or greater than a specified voltage, and on signals may be applied when the voltages of the second line are equal to or greater than a specified voltage.

In the generating of the first signals from the first signal generation units according to the voltages of the first line in the respective chips and the second signals from the second signal generation units according to the voltages of the second line in the respective chips, the first signals and the second signals may be generated by diodes.

In the combining of the first signals and the second signals and generating the chip selection signals, the chip selection signals may be generated by one or more logic gates which receive, as input signals, the first signals and the second signals.

In the combining of the first signals and the second signals and generating the chip selection signals, the chip selection signals may be generated from at least two chips among the plurality of chips.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
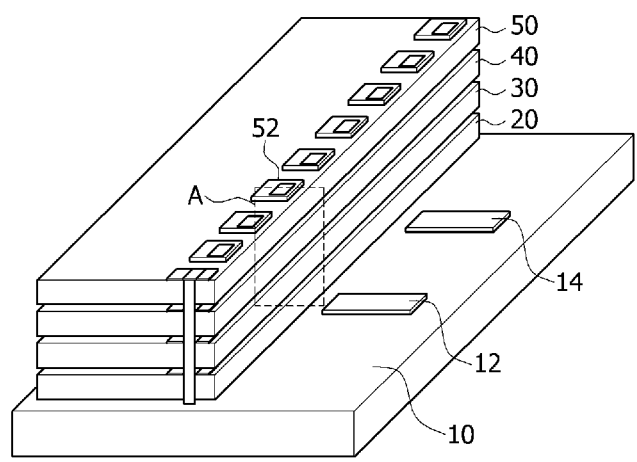
FIG. 1 is a perspective view of a conventional stack package.
Figure 2:
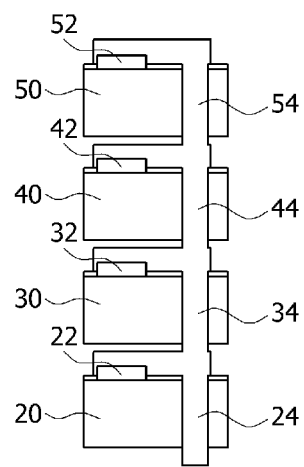
FIG. 2 is a cross-sectional view of the part A (a chip selection pad part) of FIG. 1.
Figure 3:
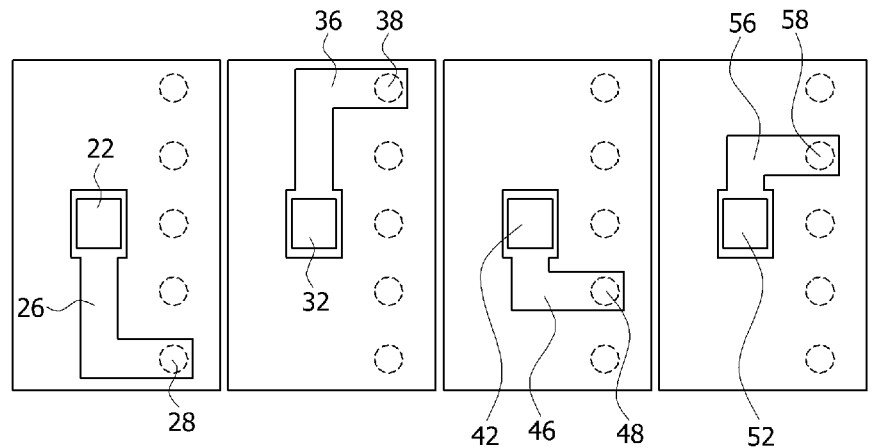
FIG. 3 is a plan view showing an example of connecting chip selection pads using redistribution layers.
Figure 4:
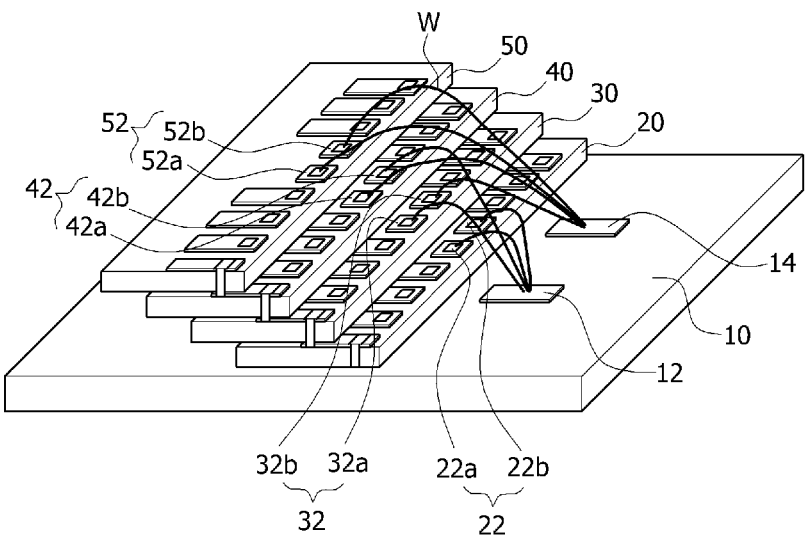
FIG. 4 is a perspective view showing a method for selecting a chip using wires.
Figure 5:
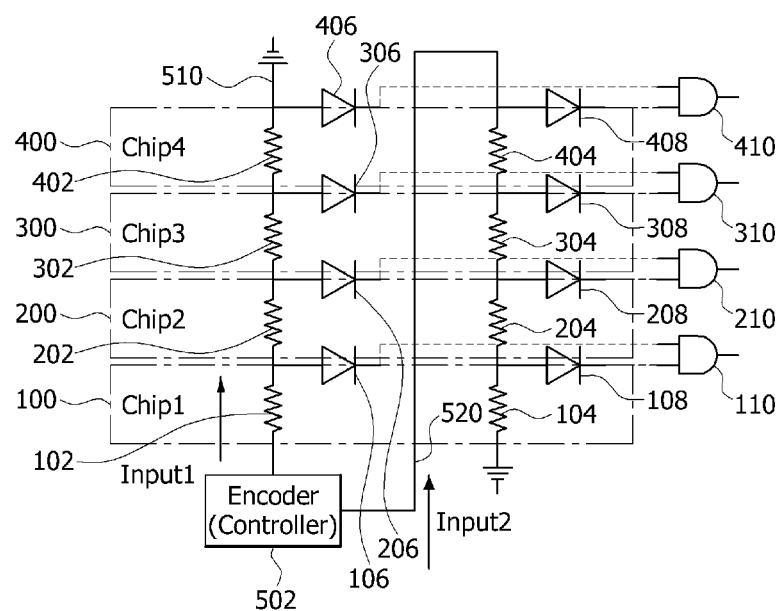
FIG. 5 is a conceptual view showing the configuration of a stack package in accordance with an embodiment of the present invention.

FIG. 5 is a conceptual view showing the configuration of a stack package in accordance with an embodiment of the present invention.

Referring to FIG. 5, in a stack package in accordance with an embodiment of the present invention, four chips 100, 200, 300 and 400 are stacked. The respective chips 100, 200, 300 and 400 are provided with first voltage dropping units 102, 202, 302 and 402, second voltage dropping units 104, 204, 304 and 404, first signal generation units 106, 206, 306 and 406, second signal generation units 108, 208, 308 and 408, and chip selection signal generation units 110, 210, 310 and 410, respectively.

The stack package in accordance with an embodiment of the present invention has a structure in which a plurality of chips are stacked, e.g., vertically, and the four chips shown in FIG. 5 represent a mere example. Each chip has at least two through-silicon vias (TSVs). A Voltage or current from a controller 502 is applied to a first line 510, which is formed by connecting a plurality of first through-silicon vias (not shown) in series, and a second line 520, which is formed by connecting a plurality of second through-silicon vias (not shown) in series, and their current flow directions may be set opposite to each other.

The first voltage dropping units 102, 202, 302 and 402 and the second voltage dropping units 104, 204, 304 and 404, which are formed in the respective chips, are not specifically limited so long as they function to drop the voltages applied from the controller 502. For example, the first voltage dropping units 102, 202, 302 and 402 may be through-silicon vias themselves. That is, through-silicon vias may be used as resistors. Otherwise, the first voltage dropping units 102, 202, 302 and 402 may be resistors which are separately formed on through-silicon vias. The amount of voltage drop of the first voltage dropping units 102, 202, 302 and 402 and the second voltage dropping units 104, 204, 304 and 404 may be the same with or different from each other. In another example, the amount of voltage drop of the first voltage dropping units 102, 202, 302 and 402 may be the same with one another and the amount of voltage drop of the second voltage dropping units 104, 204, 304 and 404 may be the same with one another, and the amount of voltage drop of the first voltage dropping units 102, 202, 302 and 402 and the second voltage dropping units 104, 204, 304 and 404 may be different from each other. In various embodiments of the present invention, the meaning of the same includes substantially the same.

The first signal generation units 106, 206, 306 and 406 and the second signal generation units 108, 208, 308 and 408 transmit "on" signals to the chip selection signal generation units 110, 210, 310 and 410 depending upon levels of the first voltage dropping units 102, 202, 302 and 402 and the second voltage dropping units 104, 204, 304 and 404. In other words, the first signal generation units 106, 206, 306 and 406 and the second signal generation units 108, 208, 308 and 408 may transmit "on" signals when the voltages of the first voltage dropping units 102, 202, 302 and 402 and the second voltage dropping units 104, 204, 304 and 404 are higher than a predetermined voltage. Also, the first signal generation units 106, 206, 306 and 406 and the second signal generation units 108, 208, 308 and 408 may transmit the "on" signals when the voltages of the first voltage dropping units 102, 202, 302 and 402 and the second voltage dropping units 104, 204, 304 and 404 are lower than a predetermined voltage. The "on" signals may be digital signals or analog signals. As an example, FIG. 5 shows that the first signal generation units 106, 206, 306 and 406 and the second signal generation units 108, 208, 308 and 408 are diodes. Here, the "on" signals may be high level signals.

The chip selection signal generation units 110, 210, 310 and 410 combine the "on" and "off" signals transmitted from the first signal generation units 106, 206, 306 and 406 and the second signal generation units 108, 208, 308 and 408, and generate electrical signals which determine which chip among the plurality of chips will be selected. For example, the chip selection signal generation units 110, 210, 310 and 410 may be logic gates. The chip selection signal generation units 110, 210, 310 and 410 may be a combination of logic gates including at least any one of an AND gate, an OR gate, an inverter, a NAND gate, a NOR gate, an XOR gate and an XNOR gate. As an example, in FIG. 5, the chip selection signal generation units 110, 210, 310 and 410 include AND gates.

Figure 6:
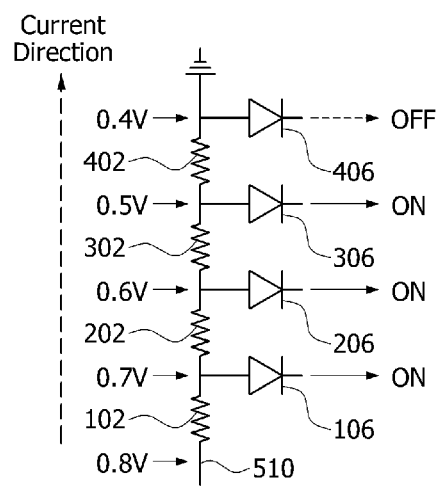
FIGS. 6 to 8 are conceptual views explaining chip selection operations of the stack package in accordance with an embodiment of the present invention.
Figure 7:
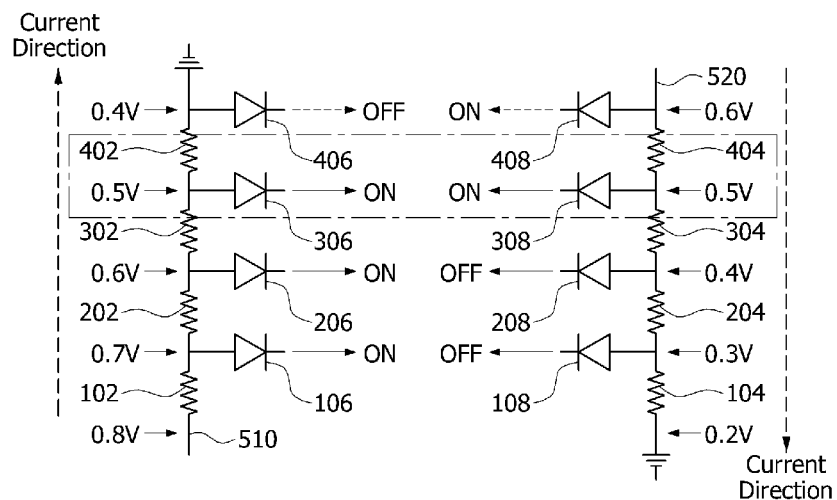
Figure 8:
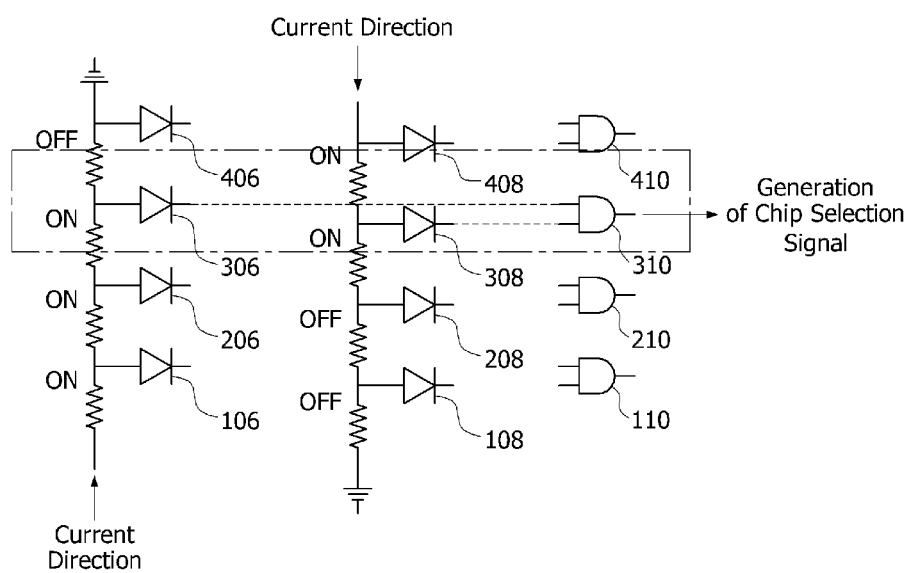

FIGS. 6 to 8 are conceptual views explaining chip selection operations of the stack package in accordance with an embodiment of the present invention. In various embodiments, since the first voltage dropping units 102, 202, 302 and 402 and the second voltage dropping units 104, 204, 304 and 404 are resistors, terms, 'voltage dropping units' and 'resistors' will be used together, and since the first signal generation units 106, 206, 306 and 406 and the second signal generation units 108, 208, 308 and 408 are diodes, terms, 'signal generation units' and 'diodes' will be used together.

A method (or an operation) for selecting a chip in a stack package in accordance with an embodiment of the present invention includes applying a first voltage to a first line formed by connecting in series first voltage dropping units respectively formed in a plurality of chips and a second voltage to a second line formed by connecting in series second voltage dropping units respectively formed in the plurality of chips; generating first signals from first signal generation units according to voltages of the first line in the respective chips and second signals from second signal generation units according to voltages of the second line in the respective chips; and combining the first signals and the second signals and generating a chip selection signal.

Referring to FIG. 6, according to Ohm's Law (V=IR), current flowing through the first line 510 is constant, and voltage drop occurs each time current flows through each resistor. In an example, assuming that current is 0.1 A and the resistance of the respective resistors 102, 202, 302 and 402 is 1Ω, voltage drop of 0.1V occurs each time current flows through each resistor. That is, if a voltage before current flows through the first resistor 102 is 0.8V, voltage drop of 0.1V occurs after current flows through the first resistor 102, and the voltage becomes 0.7V. Then, the voltage becomes 0.6V after current flows through the second resistor 202, 0.5V after current flows through the third resistor 302, and 0.4V after current flows through the fourth resistor 402.

The plurality of first signal generation units 106, 206, 306 and 406 may be diodes. Diodes allow current flow only in one direction, and may be manufactured using a known semiconductor fabrication method. Diodes have characteristics that current flows from anodes to cathodes, that is, only in a forward direction, at a voltage equal to or greater than a threshold voltage (Vth). For instance, in the case where diodes with a threshold voltage of 0.5V are used, as can be seen from FIG. 6, current flows to cathodes in the first diode 106, the second diode 206 and the third diode 306 which are connected to the first line 510 and have the voltages equal to or greater than 0.5V. Since the voltage of 0.4V less than the threshold voltage is applied to the fourth diode 406, current does not flow to a cathode (in the forward direction). In an embodiment, if current flows in the forward direction, the diodes generate "on" signals, and if current does not flow in the forward direction, the diodes generate "off" signals. Here, the "off" signals may be low level signals.

Referring to FIG. 7, the second line 520 is set in such a manner that current flows in an opposite direction to the first line 510, and voltage drop occurs in a downward direction. For example, assuming that the respective resistors constituting the second voltage dropping units 104, 204, 304 and 404 have resistance of 1Ω and current is 0.1 A, since current flows in an opposite direction, when a voltage of 0.6V is applied to the eighth diode 408, voltage drop of 0.1V occurs after current flows through the eighth resistor 404, and a voltage of 0.5V is applied to the seventh diode 308. Then, a voltage of 0.4V is applied to the sixth diode 208 after current flows through the seventh resistor 304, and a voltage of 0.3V is applied to the fifth diode 108 after current flows through the sixth resistor 204. Namely, current flows in a forward direction only in the seventh diode 308 and the eighth diode 408 to which voltages equal to or greater than the threshold voltage of 0.5V are applied, and "on" signals are generated.

Referring to FIG. 8, "on" signals are generated only from the first diode 106, the second diode 206 and the third diode 306 among the diodes constituting the first signal generation units 106, 206, 306 and 406, and "on" signals are generated only from the seventh diode 308 and the eighth diode 408 among the diodes constituting the second signal generation units 108, 208, 308 and 408. Among the first signal generation units 106, 206, 306 and 406 and the second signal generation units 108, 208, 308 and 408, "on" signals are outputted only from the third diode 306 and the seventh diode 308.

The chip selection signal generation units 110, 210, 310 and 410, which are connected with the first signal generation units 106, 206, 306 and 406 and the second signal generation units 108, 208, 308 and 408, may include AND gates. Since an AND gate is a logic gate in which an "on" signal is outputted from an output terminal when "on" signals are inputted to both input terminals, only the AND gate or the third AND gate 310, which is formed in the third chip 300 connected with the third diode 306 and the seventh diode 308, outputs an "on" signal, by which the third chip 300 formed with the third AND gate 310 can be selected.

The following Table 1 shows an exemplary embodiment of a method for selecting a chip in a stack package in which four chips are stacked. In Table 1, A means a signal which is outputted from a first signal generation unit, B means a signal which is outputted from a second signal generation unit, C means a signal which is outputted from a chip selection signal generation unit when the chip selection signal generation unit includes an AND gate, X means an "off" signal (e.g., a digital signal of 0), 0 means an "on" signal (e.g., a digital signal of 1), and CS means a chip selection signal. A current flow direction in a first line to which first signal generation units are connected is opposite to a current flow direction in a second line to which second signal generation units are connected. As can be readily seen from Table 1, in the case where chip selection signal generation units include AND gates, a chip is selected when both A and B are "on" signals.

TABLE 1

|  | When first chip is selected | | | When second chip is selected | | | When third chip is selected | | When fourth chip is selected | | |
| --- | --- | --- | --- | --- | --- | --- | --- | --- | --- | --- | --- |
|  | A | B | C | A | B | C | A | B | A | B | C |
| Fourth chip | X | O |  | X | O |  | X | O | O | O | CS |
| Third chip | X | O |  | X | O |  | O | O CS | O | X |  |
| Second chip | X | O |  | O | O | CS | O | X | O | X |  |
| First chip | O | O | CS | O | X |  | O | X | O | X |  |

The following Table 2 shows an exemplary embodiment of a method for selecting a chip in a stack package in which four chips are stacked. In Table 2, A means a signal which is outputted from a first signal generation unit, B means a signal which is outputted from a second signal generation unit, C means a signal which is outputted from a chip selection signal generation unit when the chip selection signal generation unit includes a NOR gate, X means an "off" signal (a digital signal of 0), 0 means an "on" signal (a digital signal of 1), and CS means a chip selection signal. A current flow direction in a first line to which first signal generation units are connected is opposite to a current flow direction in a second line to which second signal generation units are connected. As can be readily seen from Table 2, in the case where chip selection signal generation units include NOR gates, a chip is selected when both A and B are "off" signals.

TABLE 2

|  | When first chip is selected | | | When second chip is selected | | | When third chip is selected | | When fourth chip is selected | | |
| --- | --- | --- | --- | --- | --- | --- | --- | --- | --- | --- | --- |
|  | A | B | C | A | B | C | A | B | A | B | C |
| Fourth chip | X | O |  | X | O |  | X | O | X | X | CS |
| Third chip | X | O |  | X | O |  | X | X CS | O | X |  |
| Second chip | X | O |  | X | X | CS | O | X | O | X |  |
| First chip | X | X | CS | O | X |  | O | X | O | X |  |

The first voltage dropping units 102, 202, 302 and 402 and the second voltage dropping units 104, 204, 304 and 404 may include through-silicon vias, respectively. In other words, by controlling the kind of a conductive material constituting the through-silicon vias and by controlling the length and sectional area of the through-silicon vias, resistors causing voltage drop by a certain voltage may be formed.

A substance capable of being used to form through-silicon vias for causing voltage drop may include a single layer or multiple layers of at least any one metal selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), a nitride of those metals, polysilicon, and a conductive organic material. For example, assuming that the diameter and the length L of through-silicon vias are respectively 10 μm and 80 μm, since R=ρL/A (A is a sectional area of the through-silicon vias), voltage drop of 0.5Ω occurs when the through-silicon vias are formed by filling a through-silicon hole with titanium having specific resistance (ρ) of 0.0000005 Ωm, voltage drop of 2Ω occurs when the through-silicon vias are formed by filling the through-silicon hole with TiN having specific resistance (ρ) of 0.000002 Ωm, and voltage drop of 2.5Ω occurs when the through-silicon vias are formed by filling the through-silicon hole with polysilicon having specific resistance (ρ) of 0.0000025 Ωm. In particular, when polysilicon is used, specific resistance may be easily changed according to the amount and the kind of ions to be implanted. As a process for filling a through-silicon hole with a conductive material for through-silicon vias, various method such as vacuum deposition, sputtering, chemical vapor deposition (CVD), electroless plating, electroplating, screen printing may be used.

In an embodiment, through-silicon vias may be formed using copper having excellent electrical conductivity, and resistors may be separately formed on the upper or lower ends of the through-silicon vias.

Figure 9:
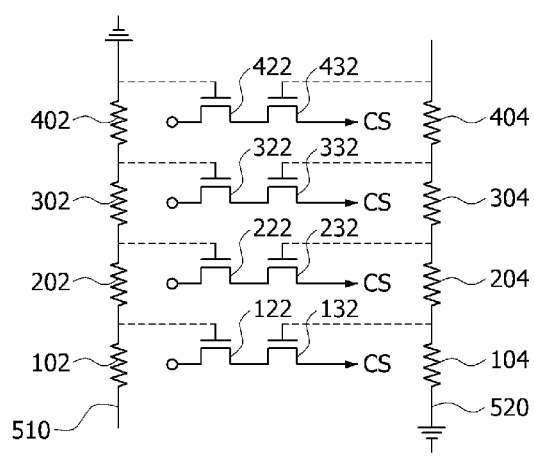
FIG. 9 is a conceptual view showing the configuration of a stack package in accordance with an embodiment of the present invention.

FIG. 9 is a conceptual view showing the configuration of a stack package in accordance with an embodiment of the present invention.

Referring to FIG. 9, first voltage dropping units 102, 202, 302 and 402 and second voltage dropping units 104, 204, 304 and 404, which are formed in respective stacked chips, include resistors, for example. The resistors may be through-silicon vias themselves or resistors which are formed on one ends of the through-silicon vias. As mentioned above, an amount of voltage drop may be regulated through controlling the kind of a conductive material constituting the through-silicon vias and the length and sectional area of the through-silicon vias. Current flow through a first line 510 formed by connecting the first voltage dropping units 102, 202, 302 and 402 in series and current flow through a second line 520 formed by connecting the second voltage dropping units 104, 204, 304 and 404 in series are set opposite to each other.

First signal generation units 122, 222, 322 and 422 are connected to the first line 510 formed by connecting the first voltage dropping units 102, 202, 302 and 402, and second signal generation units 132, 232, 332 and 432 are connected to the second line 520 formed by connecting the second voltage dropping units 104, 204, 304 and 404. In an embodiment of the present invention, the first signal generation units 122, 222, 322 and 422 are first transistors 122, 222, 322 and 422 which are formed in the respective chips, and the gate electrodes of the first transistors 122, 222, 322 and 422 are connected to the first line 510 formed by connecting the first voltage dropping units 102, 202, 302 and 402 in series. The second signal generation units 132, 232, 332 and 432 are second transistors 132, 232, 332 and 432 which are formed in the respective chips, and the gate electrodes of the second transistors 132, 232, 332 and 432 are connected to the second line 520 formed by connecting the second voltage dropping units 104, 204, 304 and 404 in series. Chip selection signal generation units have dual transistor structures in which the first transistors 122, 222, 322 and 422 and the second transistors 132, 232, 332 and 432 are connected with each other. That is, the chip selection signal generation units have structures in which the first signal generation units 122, 222, 322 and 422 and the second signal generation units 132, 232, 332 and 432 are connected with each other.

The resistors 102 and 104 and the transistors 122 and 132 are all formed in a chip (e.g., a first chip), and a second chip, a third chip and a fourth chip are stacked over the first chip. For example, when it is necessary to select the first chip, voltages with levels for allowing current flow from source electrodes to drain electrodes are applied (as "on" signals) to the gate electrodes of all the first transistors 122, 222, 322 and 422 of the first to fourth chips. However, in the case of the second transistors 132, 232, 332 and 432, a voltage with a level for allowing the gate electrode to open is applied only to the second transistor 132 formed in the first chip. Namely, since voltages are applied to open the gates of the first transistor 122 and the second transistor 132, current may flow from the source electrode to the drain electrode of the first transistor 122, and current may flow from the source electrode of the second transistor 132 connected to the drain electrode of the first transistor 122 to the drain electrode of the second transistor 132. In this way, a chip selection signal CS may be generated.

Figure 10:
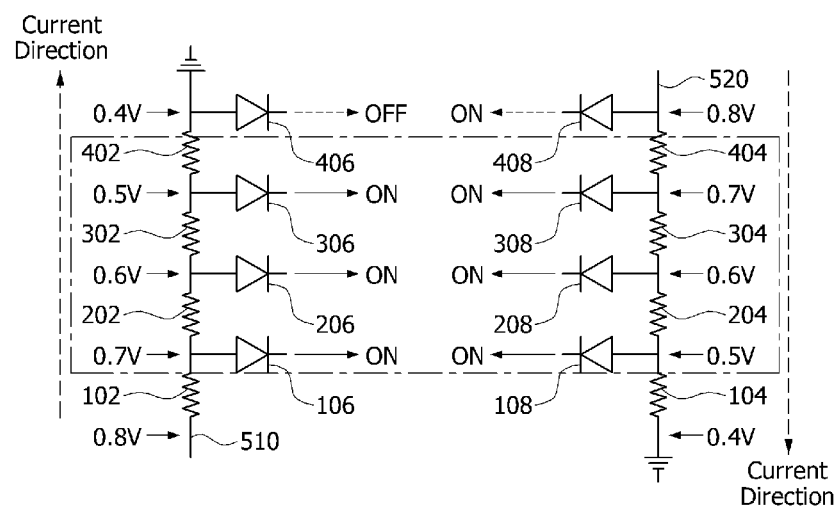
FIG. 10 is a conceptual view explaining a chip selection operation of the stack package in accordance with an embodiment of the present invention.

FIG. 10 is a conceptual view explaining a chip selection operation of the stack package in accordance with an embodiment of the present invention. The chip selection operation of the stack package will be described mainly with reference to FIG. 10, and descriptions to be repeated will be simplified or omitted.

Describing a first line 510, it is shown that a voltage before flowing through a first resistor 102 is 0.8V, a voltage after flowing through the first resistor 102 is 0.7V, a voltage after flowing through a second resistor 202 is 0.6V, a voltage after flowing through a third resistor 302 is 0.5V, and a voltage after flowing through a fourth resistor 402 is 0.4V. The first resistor 102, the second resistor 202, the third resistor 302 and the fourth resistor 402 are referred to as first voltage dropping units.

Current flows through a second line 520 in an opposite direction to the first line 510. For example, it is shown that a voltage before flowing through an eighth resistor 404 is 0.8V, a voltage after flowing through the eighth resistor 404 is 0.7V, a voltage after flowing through a seventh resistor 304 is 0.6V, a voltage after flowing through a sixth resistor 204 is 0.5V, and a voltage after flowing through a fifth resistor 104 is 0.4V.

A plurality of first signal generation units 106, 206, 306 and 406 may include diodes. For example, in the case where a diode with a threshold voltage 0.5V is used, as can be readily seen from FIG. 10, current flows toward cathodes in the first diode 106, the second diode 206 and the third diode 306 which are connected to the first line 510 and have voltages equal to or greater than 0.5V. In the fourth diode 406 with the voltage of 0.4V, since the voltage is less than the threshold voltage, current does not flow toward a cathode. Similarly, since voltages equal to or greater than the threshold voltage are applied to the eighth diode 408, the seventh diode 308, the sixth diode 208 and the fifth diode 108, "on" signals are generated.

If chip selection signal generation units include AND gates, lower three semiconductor chips are selected in FIG. 10. It may be necessary to select a plurality of chips at a time depending upon an application of a stack package. In the chip selection method according to an embodiment of the present invention, a plurality of chips may be selected at a time.

Figure 11:
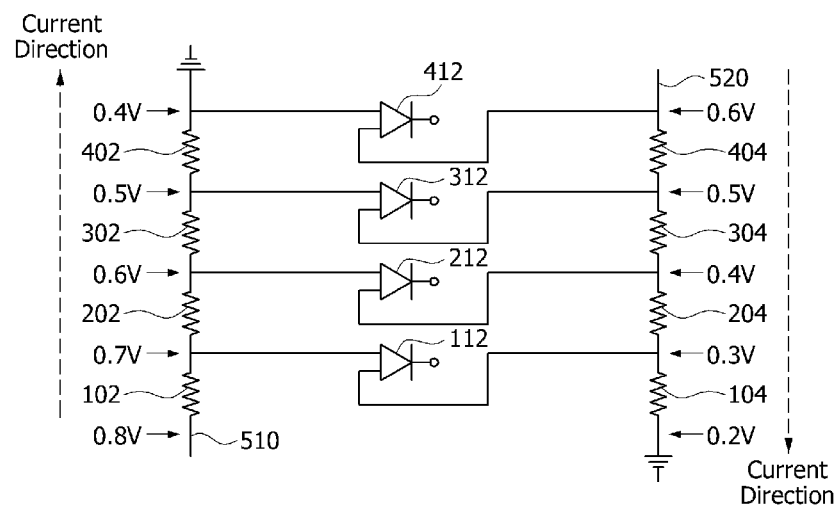
FIG. 11 is a conceptual view explaining a chip selection operation of a stack package in accordance with still an embodiment of the present invention.

FIG. 11 is a conceptual view explaining a chip selection operation of a stack package in accordance with an embodiment of the present invention. The chip selection operation of a stack package will be described mainly with reference to FIG. 11, and descriptions to be repeated will be simplified or omitted.

Referring to FIG. 11, generation of chip selection signals may be implemented through voltage comparators. For example, a first voltage comparator 112 is formed in a first chip, a second voltage comparator 212 is formed in a second chip, a third voltage comparator 312 is formed in a third chip, and a fourth voltage comparator 412 is formed in a fourth chip. For example, assuming that the voltage comparators are set to output "on" signals when a voltage difference is equal to or less than 0.3V, the second voltage comparator 212, the third voltage comparator 312 and the fourth voltage comparator 412 output "on" signals, and thus, the second chip, the third chip and the fourth chip are selected.

The voltage comparators may be configured to select a plurality of chips as just described above, and voltage comparators may be configured to select a certain chip.

As is apparent from the above descriptions, in the stack package and the method for selecting a chip in a stack package in accordance with an embodiments of the present invention, a chip can be selected through a simple way while not increasing the size of a stack package and obviating the need for redistribution layers.

Also, a configuration of a chip selection circuit and a manufacturing process can be simplified.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A stack package having a plurality of chips which are stacked, comprising:
   first voltage dropping units respectively formed in the plurality of chips, the first voltage dropping units are electrically coupled by a first line;
   second voltage dropping units respectively formed in the plurality of chips, the second dropping units are electrically coupled by a second line;
   first signal generation units respectively formed in the plurality of chips, each of the first signal generation units is connected to an output node of the first voltage dropping units, respectively; and
   second signal generation units respectively formed in the plurality of chips, each of the second signal generation units is connected to an input node of the second voltage dropping units, respectively,
   wherein a first bias is applied to be transferred from the first voltage dropping unit of the lowest chip to the first voltage dropping unit of the highest chip through the first line, and
   a second bias is applied to be transferred from the second voltage dropping unit of the highest chip to the second voltage dropping unit of the lowest chip through the second line.

2. The stack package according to claim 1, wherein the respective first voltage dropping units and the respective second voltage dropping units are through-silicon vias which are formed in the plurality of chips.

3. The stack package according to claim 2, wherein the through-silicon vias include at least any one metal selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), a nitride of those metals, or polysilicon.

4. The stack package according to claim 1, wherein the respective first voltage dropping units and the respective second voltage dropping units are resistors which are formed on respective through-silicon vias formed in the plurality of chips.

5. The stack package according to claim 1, wherein the first signal generation units are configured to output high level signals when input levels of the first signal generation units are equal to or greater than a first preset voltage, respectively, and the second signal generation units are configured to output high level signals when input levels of the second signal generation units are equal to or greater than a second preset voltage.

* * * * *